(12) United States Patent
Shin (10) Patent No.: US 12,127,311 B2
(45) Date of Patent: Oct. 22, 2024

(54) FAR INFRARED RAY-RADIATING AND ELECTROMAGNETIC WAVE-SHIELDING HEATING WIRE USING GRAPHENE PLATE

(71) Applicant: GHL CO., LTD., Namyangju-si (KR)

(72) Inventor: Ki Young Shin, Namyangju-si (KR)

(73) Assignee: GHL CO., LTD., Namyangju-si (KR)

( * ) Notice: Subject to any disclaimer, the term of this patent is extended or adjusted under 35 U.S.C. 154(b) by 785 days.

(21) Appl. No.: 17/290,534

(22) PCT Filed: Oct. 14, 2019

(86) PCT No.: PCT/KR2019/013420
§ 371 (c)(1),
(2) Date: Apr. 30, 2021

(87) PCT Pub. No.: WO2020/096214
PCT Pub. Date: May 14, 2020

(65) Prior Publication Data
US 2021/0378062 A1     Dec. 2, 2021

(30) Foreign Application Priority Data
Nov. 6, 2018   (KR) .......................... 10-2018-0135245

(51) Int. Cl.
*H05B 3/56*      (2006.01)
*H01B 7/42*      (2006.01)
(Continued)

(52) U.S. Cl.
CPC ............... *H05B 3/56* (2013.01); *H01B 7/428* (2013.01); *H05B 3/145* (2013.01); *H05K 9/0081* (2013.01); *H05K 9/0098* (2013.01)

(58) Field of Classification Search
CPC .......... H05B 3/56; H05B 3/145; H01B 7/428; H01B 13/02; H05K 9/0081; H05K 9/0098
See application file for complete search history.

(56) References Cited

U.S. PATENT DOCUMENTS

| 6,300,597 B1 * | 10/2001 | Lee ...................... H05B 1/0272 219/544 |
| 2008/0029502 A1 * | 2/2008 | You ......................... H05B 3/56 219/212 |
| 2018/0220494 A1 | 8/2018 | Kim et al. |

FOREIGN PATENT DOCUMENTS

| CN | 111083814 A | * | 4/2020 |
| KR | 200173219 | | 3/2000 |

(Continued)

OTHER PUBLICATIONS

International Search Report—PCT/KR2019/013420 dated Feb. 3, 2020.

(Continued)

*Primary Examiner* — Nathaniel E Wiehe
*Assistant Examiner* — Dilnessa B Belay
(74) *Attorney, Agent, or Firm* — CANTOR COLBURN LLP (57) ABSTRACT

Provided is a far infrared ray-radiating and electromagnetic wave-shielding heating wire using a graphene plate. The heating wire includes: one core wire formed by binding several strands of threads, each of which has a graphene plate conductive layer formed therein; and a plurality of strands of heat wires covered by a covering material and wound around the outer surface of the core wire. Accordingly, when the heating wire is heated by supplied power, heat conductivity is improved, so that electricity consumption in an electric heating product is reduced and the effect of radiating far infrared rays and shielding electromagnetic waves is enhanced. In addition, even when the heating wire is bent and transformed according to the use of the product, disconnection and the risk of fire caused thereby are prevented, so that usage stability of an electric heating product group to which the heating wire is applied is enhanced.

4 Claims, 7 Drawing Sheets

(51) Int. Cl.
*H05B 3/14* (2006.01)
*H05K 9/00* (2006.01)

(56) References Cited

FOREIGN PATENT DOCUMENTS

| KR | 200324730 | 8/2003 | | |
|----|-----------|--------|----|----------|
| KR | 100724605 B1 * | 5/2006 | ........... | A47C 21/048 |
| KR | 101081283 | 11/2011 | | |
| KR | 20120028199 | 3/2012 | | |
| KR | 20130015042 | 2/2013 | | |
| KR | 101549344 | 9/2015 | | |
| KR | 101905577 | 10/2018 | | |
| KR | 102001176 | 7/2019 | | |

OTHER PUBLICATIONS

PCT Written Opinion—PCT/KR2019/013420 issued on Feb. 3, 2020, citing KR 10-1549344, KR 2013-0015042, KR20-0324730, KR 2012-0028199, and US 2018/0220494.

* cited by examiner

FAR INFRARED RAY-RADIATING AND ELECTROMAGNETIC WAVE-SHIELDING HEATING WIRE USING GRAPHENE PLATE

TECHNICAL FIELD

The present invention relates to a far infrared ray-radiating and electromagnetic wave-shielding heating wire using a graphene plate, exhibiting effects of conducting heat, radiating far-infrared rays, and shielding electromagnetic waves, as well as preventing a product from bending when applied to the product.

BACKGROUND ART

In general, electric heating bedding, including an electric blanket, an electric pad, an electric mat, an electric carpet, and the like, and an electric hot pack, which is specialized for a specific part of a body (e.g., an arm, a leg, a waist, a shoulder, a back, or the like), may be heated or steamed at a certain temperature by converting electrical energy into heat energy to generate heat.

Meanwhile, heating wires are applied to the electric heating bedding or the electric hot pack and arranged at predetermined intervals inside lagging materials applied to the product, and a temperature control device for supplying power to the heating wires is generally provided at ends of the heating wires in order to maintain a temperature arbitrarily set by a user.

In addition, the above-described heating wire generates heat due to electrical resistance thereof when current is supplied from a power supply, and since the heating wire has to pass the current, the heating wire is made of a conductor and the heating wire, which is a conductor, has a structure covered by an inner covering material.

Here, a conducting wire for offsetting electromagnetic waves may be connected to the above-described heating wire, and the conducting wire has a structure wound around an outer circumferential surface of the insulating covering material and further covered by an outer covering material.

However, when the above-described heating wire structure is applied to electric heating bedding or an electric hot pack, a problem such as bending deformation occurs seriously, and a problem of being exposed to disconnection and a risk of fire caused by the disconnection also occurs.

That is, since a structural design, which allows a tensile force to be greatly reflected to the heating wire that is applied to the electric heating bedding and the electric hot pack, is not made at all, when pressure is applied to a specific area of a mat-type electric heating bedding, or a wearable electric hot pack is used by being folded, there is always a risk of disconnection due to repetitive bending and deformation of the heating wire, and a risk of fire due to the disconnection.

DISCLOSURE

Technical Problem

The present invention is directed to providing a far infrared ray-radiating and electromagnetic wave-shielding heating wire using a graphene plate, capable of reducing electricity consumption in an electric heating product by increasing heat conductivity when the heating wire is heated by a supplied power, increasing an effect of radiating far-infrared rays and shielding electromagnetic waves, and preventing disconnection and the risk of fire due to the disconnection even when the heating wire is bent and deformed as the product is used, by tying several strands of threads, on each of which a graphene plate conductive layer is formed, to form a single core wire and then winding a plurality of strands of heating wires, which are covered by a covering material, on an outer surface of the core wire.

Technical Solution

One aspect of the present invention provides a far infrared ray-radiating and electromagnetic wave-shielding heating wire using a graphene plate, including a core wire portion formed by covering a plurality of threads with a conductive covering material, a heat wire portion wound on an outer circumferential surface of the conductive covering material in a rotating direction and a reverse-rotating direction with the core wire portion as a rotation axis, and a covering material covering both the core wire portion and the heat wire portion, wherein a conductive layer is formed on a surface of each of the threads by applying a graphene plate thereto.

The conductive covering material may be conductive silicone.

Each of the threads may be a flame-retardant thread or a glass fiber thread.

The heat wire portion may include a first heat wire and a second heat wire made of a plurality of strands, and a Teflon layer covering each of the first and second heat wires with Teflon.

The first heat wire may be spirally wound on the outer circumferential surface of the conductive covering material in the rotating direction, and the second heat wire may be spirally wound on the outer circumferential surface of the conductive covering material in the reverse-rotating direction, which is opposite to the rotating direction, so as to cross the first heat wire.

The Teflon layer may be formed by covering an outer circumferential surface of each of the first and second heat wires with Teflon.

The first heat wire and the second heat wire may have one sides connected to each other and the other sides each connected to a power controller and thus form a non-magnetic connection structure.

The heat wire portion may include a first heat wire on which a Teflon layer is formed by being covered with Teflon, and a copper wire covered by a second insulating covering material.

The first heat wire may be spirally wound on the outer circumferential surface of the conductive covering material in the rotating direction, and the copper wire may be spirally wound on the outer circumferential surface of the conductive covering material in the reverse-rotating direction, which is opposite to the rotating direction, so as to cross the first heat wire.

The first heat wire and the copper wire may have one sides connected to each other and the other sides each connected to a power controller and thus form a non-magnetic connection structure.

The covering material may include a glass fiber covering material covering both the core wire portion and the heat wire portion and a first insulating covering material covering the glass fiber covering material.

Each of the first insulating covering material and the second insulating covering material may be silicone or urethane.

Advantageous Effects

According to the present invention, a heating wire is formed by tying several strands of threads, on each of which a graphene plate conductive layer is formed, to form a single core wire and then winding a plurality of strands of heat wires, which are covered by a covering material, on an outer surface of the core wire, and accordingly, this is expected to have the effect of enhancing usage stability of an electric heating product group to which the heating wire is applied, for example, electricity consumption in an electric heating product can be reduced by increasing heat conductivity when the heating wire is heated by a supplied power, an effect of radiating far-infrared rays and shielding electromagnetic waves can be increased, and disconnection and the risk of fire due to the disconnection can be prevented from occurring even when the heating wire is bent and deformed as the product is used.

It should be noted that advantageous effects of the present invention are not limited to the above-described effects, and other effects that are not described herein will be apparent to those skilled in the art from the following descriptions.

BEST MODE OF THE INVENTION

Advantages and features of the present invention and methods for accomplishing the same will be more clearly understood from embodiments described below with reference to the accompanying drawings. However, embodiments of the technical spirit of the present invention may be embodied in various forms and are not to be construed as limited to the embodiments set forth herein. Rather, these embodiments are provided so that this disclosure is thorough and complete and will fully convey the scope of the present invention to those skilled in the art. Also, embodiments of the technical spirit of the present invention are defined only by the appended claims.

The terms used herein are for the purpose of describing particular embodiments only and are not intended to be limiting to the invention. Unless the context clearly indicates otherwise, the singular forms include the plural forms.

It should be further understood that the terms "comprises," "comprising," "includes," "including," and/or "having," when used in this specification, specify the presence of stated features, integers, steps, operations, elements, components, or groups thereof, but do not preclude the presence or addition of one or more other features, integers, steps, operations, elements, components, or groups thereof.

Further, the embodiments of the present invention are described herein with reference to cross-sectional views and/or plan views that are schematic illustrations of idealized embodiments of the present invention. Therefore, the embodiments of the present invention are not limited to the specific forms shown but may include changes in necessary forms. For example, a region illustrated as a rectangle may be rounded or have a predetermined curvature. Therefore, the regions illustrated in the drawings have schematic properties, and the shapes of the regions illustrated in the drawings are illustrative of specific shapes of regions of a device and are not intended to limit the scope of the present invention.

Throughout the specification, like reference numerals refer to like components. Therefore, although like reference numerals or similar reference numerals are not mentioned or described in the drawing, they will be described with reference to the other drawings. Further, although reference numerals are not illustrated, they will be described with reference to the other drawings.

Hereinafter, the embodiments of the present invention will be described with reference to the accompanying drawings.

Figure 1:
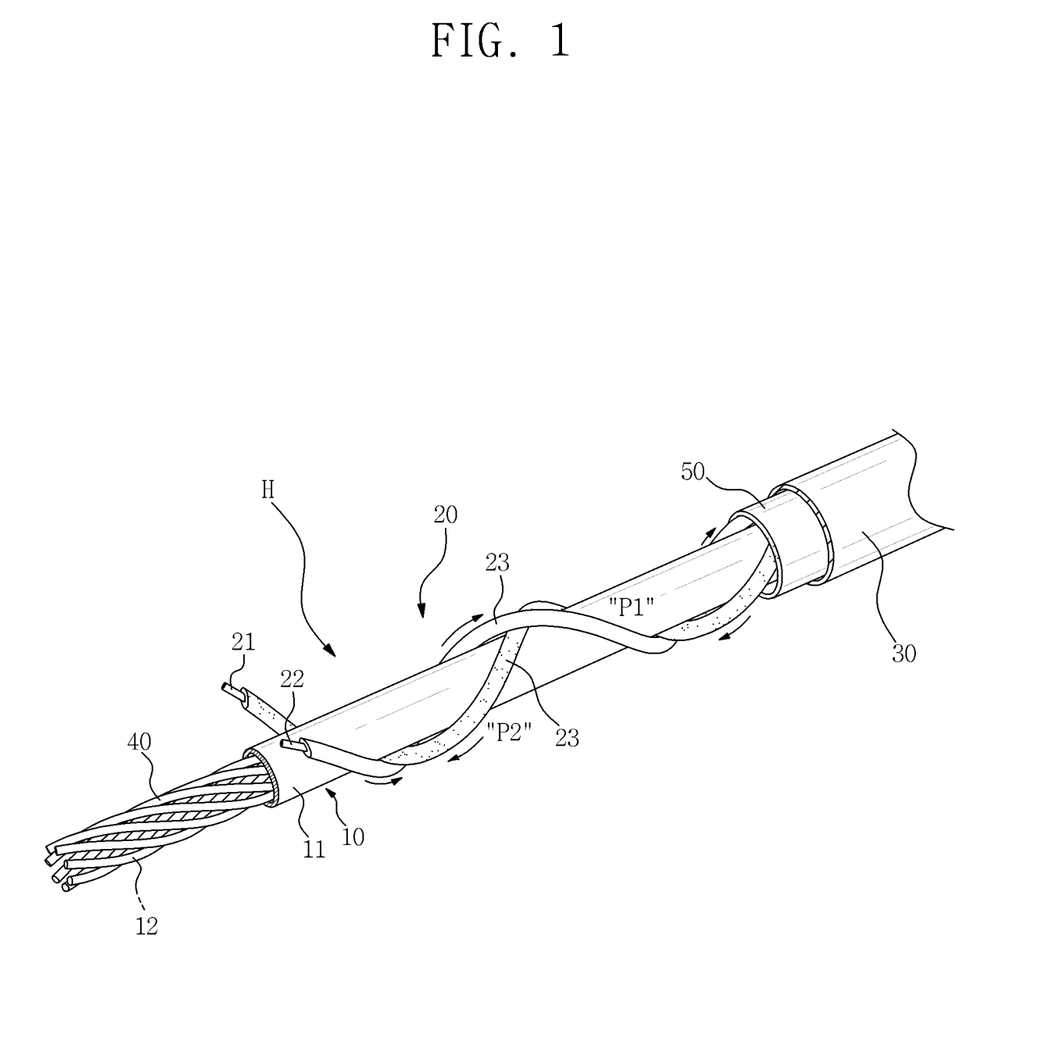
FIG. 1 is a perspective view illustrating a structure of a far infrared ray-radiating and electromagnetic wave-shielding heating wire using a graphene plate according to an embodiment of the present invention.
Figure 2:
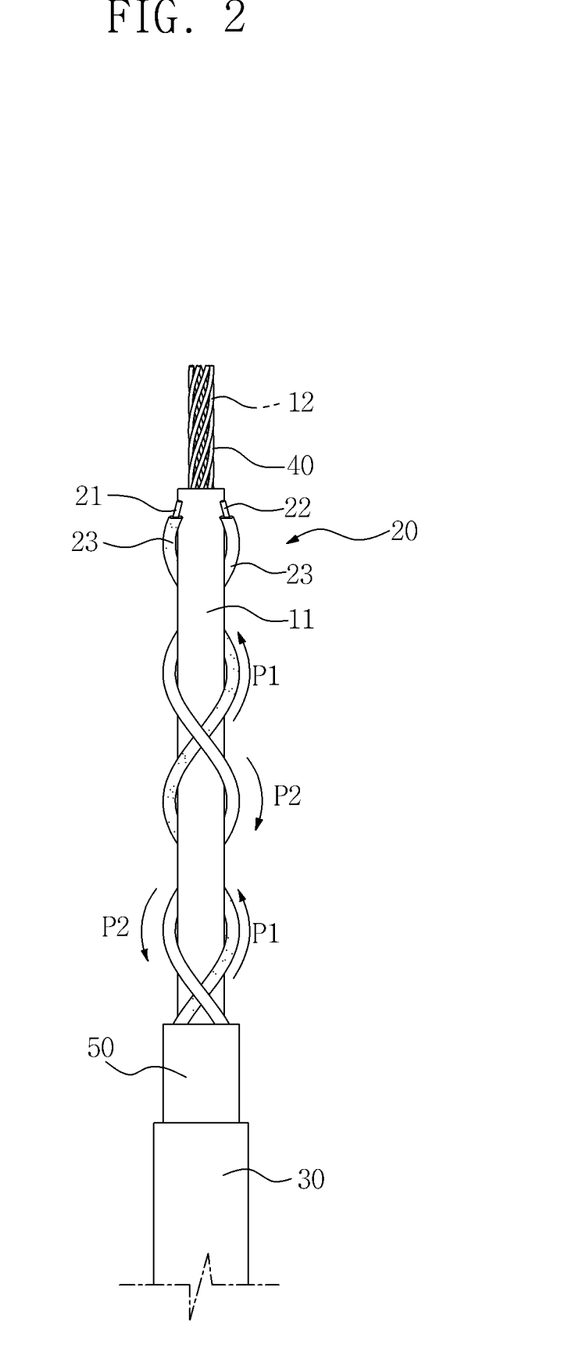
FIG. 2 is a schematic cross-sectional view illustrating the far infrared ray-radiating and electromagnetic wave-shielding heating wire using the graphene plate according to the embodiment of the present invention.
Figure 3:
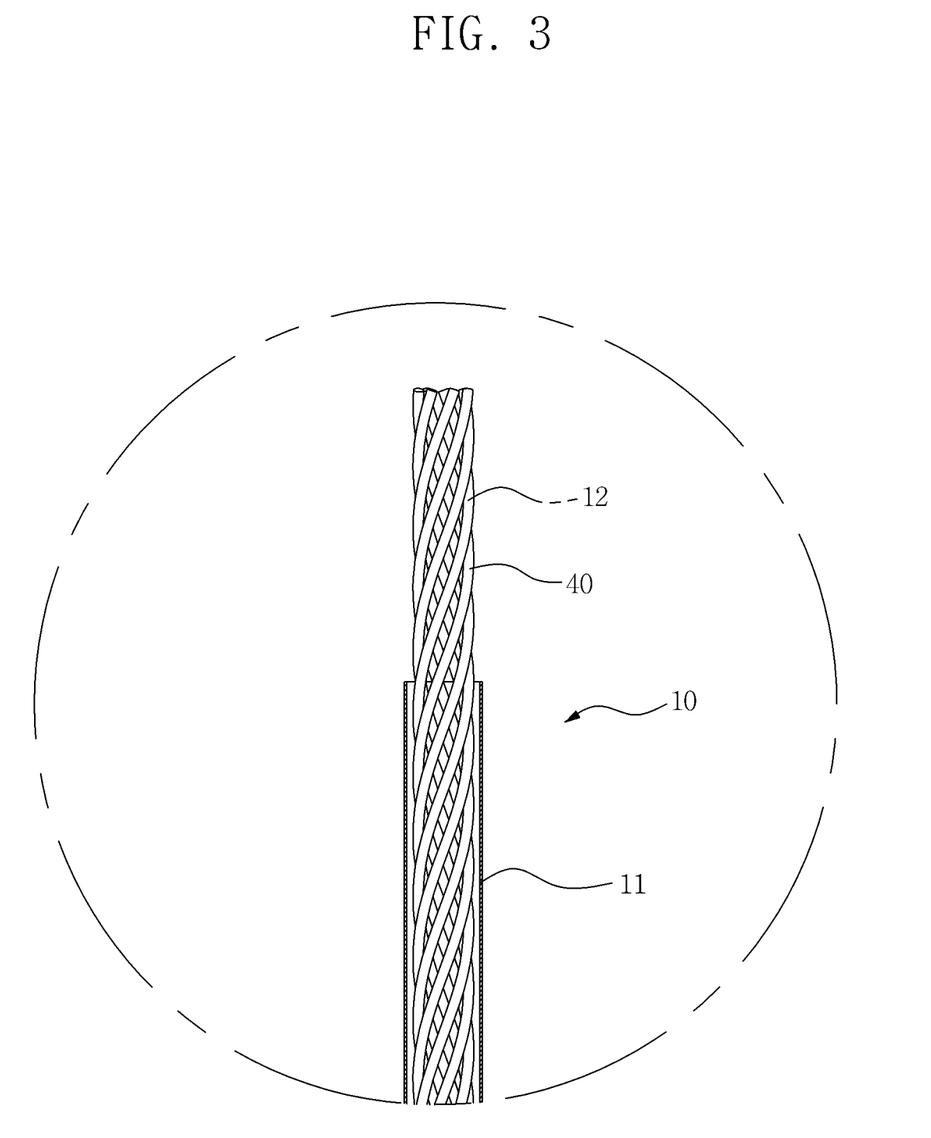
FIG. 3 is an enlarged view illustrating a bundled state of a core wire portion according to the embodiment of the present invention.

FIG. 1 is a perspective view illustrating a structure of a far infrared ray-radiating and electromagnetic wave-shielding heating wire using a graphene plate according to an embodiment of the present invention, FIG. 2 is a schematic cross-sectional view illustrating the far infrared ray-radiating and electromagnetic wave-shielding heating wire using the graphene plate according to the embodiment of the present invention, and FIG. 3 is an enlarged view illustrating a bundled state of a core wire portion according to the embodiment of the present invention.

Figure 4:
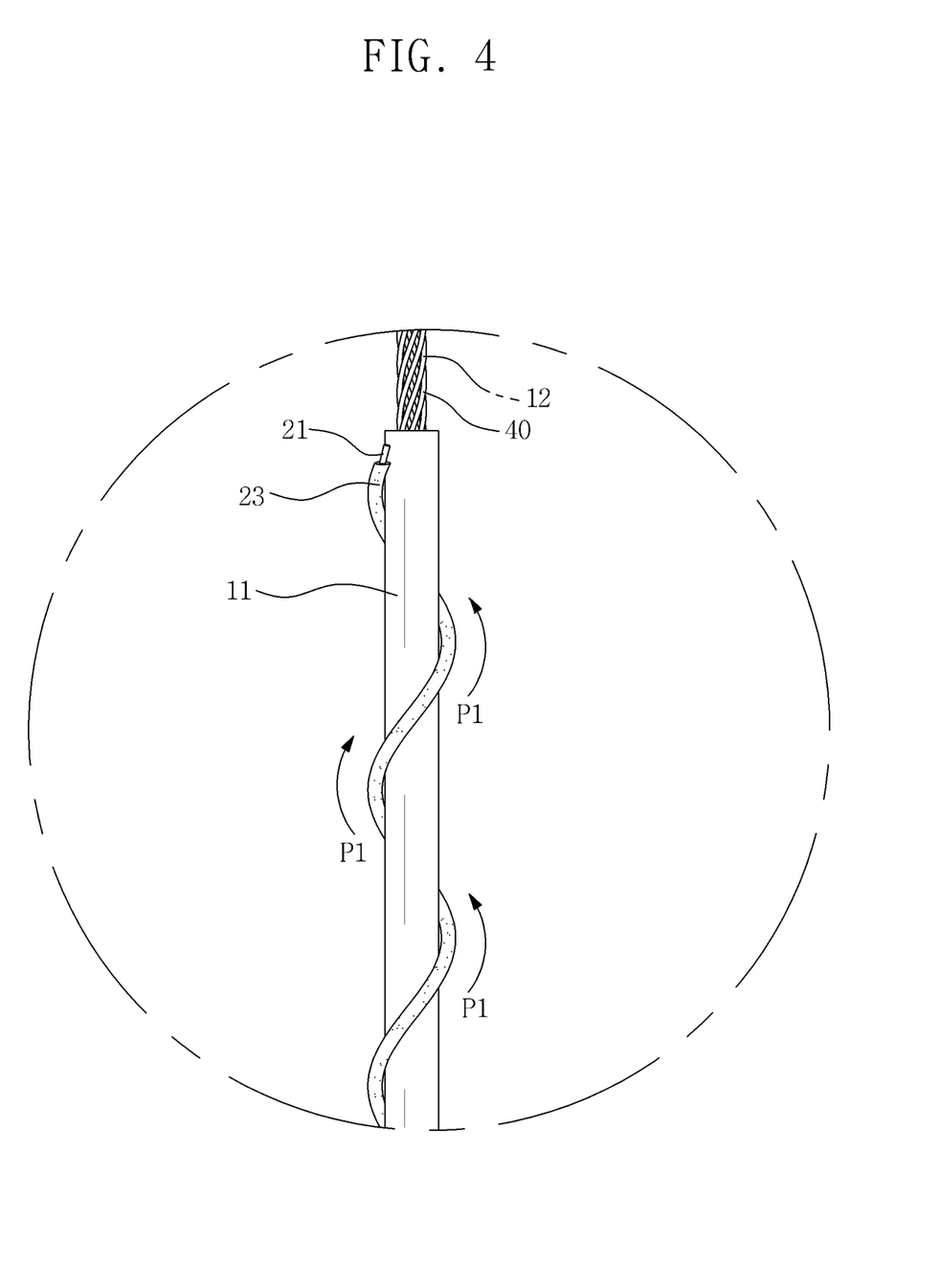
FIG. 4 is an enlarged view illustrating a state in which one strand of heat wire is wound on the core wire portion forming a rotation axis according to the embodiment of the present invention.
Figure 5:
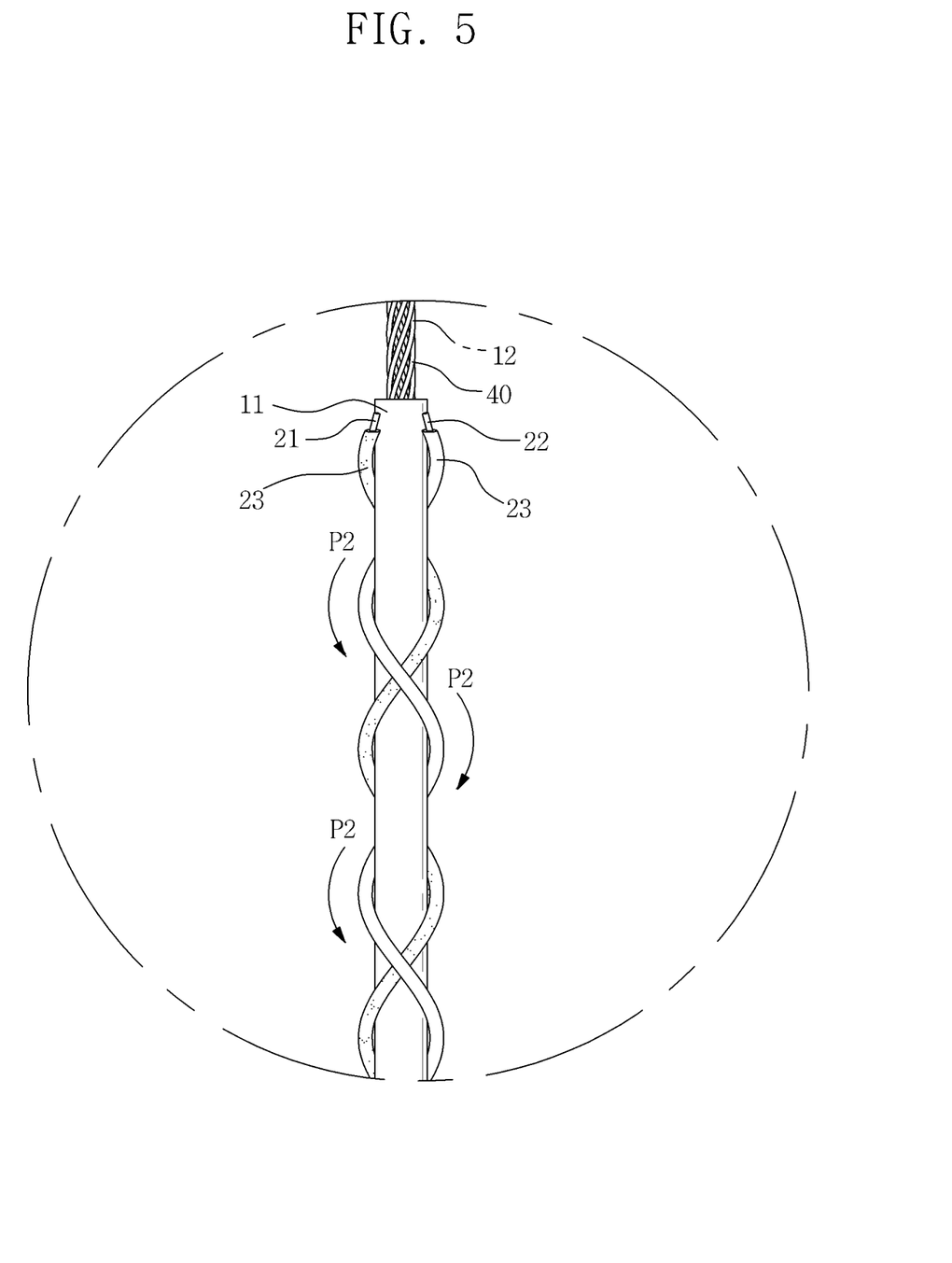
FIG. 5 is an enlarged view illustrating a state in which another strand of heat wire is additionally wound on the core wire portion forming the rotation axis according to the embodiment of the present invention.
Figure 6:
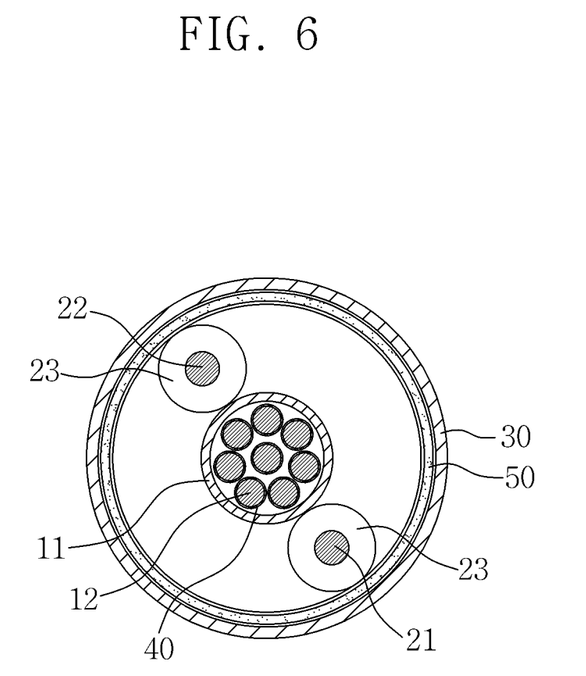
FIG. 6 is a combined cross-sectional view illustrating the far infrared ray-radiating and electromagnetic wave-shielding heating wire using the graphene plate according to the embodiment of the present invention.

FIG. 4 is an enlarged view illustrating a state in which one strand of heat wire is wound on the core wire portion forming a rotation axis according to the embodiment of the present invention, FIG. 5 is an enlarged view illustrating a state in which another strand of heat wire is additionally wound on the core wire portion forming the rotation axis according to the embodiment of the present invention, and FIG. 6 is a combined cross-sectional view illustrating the far infrared ray-radiating and electromagnetic wave-shielding heating wire using the graphene plate according to the embodiment of the present invention.

Referring to the accompanying FIGS. 1 to 6, a far infrared ray-radiating and electromagnetic wave-shielding heating wire H using a graphene plate according to the embodiment of the present invention includes a core wire portion 10, a heat wire portion 20, a first insulating covering material 30, and a glass fiber covering material 50 as covering materials, and a conductive layer 40.

The core wire portion 10 is formed by weaving and twisting five to ten strands of a plurality of threads 12, each of which is a flame-retardant thread or a glass fiber thread and is a stranded wire having a diameter of 0.2 to 0.5 mm.

Here, the threads 12 are covered by a conductive covering material 11 made of conductive silicone, and the conductive covering material 11 is configured to conduct heat when the heat wire portion 20 is heated.

Here, the conductive silicone includes conductive metal particles, a room temperature moisture-curable silicone resin component, and an organic solvent as main components, uses metal powders such as silver, copper, and nickel as a conductive filler, or includes a carbon component. Accordingly, when the conductive silicone is used to form the conductive covering material 11, the conductive covering material 11 may increase heat transfer efficiency when the heat wire portion 20 is heated and implement an electromagnetic wave shielding function.

The heat wire portion 20 is wound on an outer circumferential surface of the conductive covering material 11 in a rotating direction and a reverse-rotating direction with the core wire portion 10 as a rotation axis and includes a first heat wire 21, a second heat wire 22, and a Teflon layer 23.

The first heat wire 21 is spirally wound on the outer circumferential surface of the conductive covering material 11 in a rotating direction P1 (counterclockwise) with the core wire portion 10 as a rotation axis, and the second heat wire 22 is spirally wound on the outer circumferential surface of the conductive covering material 11 in a reverse-rotating direction P2 (clockwise) with the core wire portion 10 as a rotation axis so as to cross the first heat wire 21.

Here, one side of the first heat wire 21 and one side of second heat wire 22 are connected to each other, and the other side of the first heat wire 21 and the other side of the second heat wire 22 are connected to a power controller (not shown), thereby forming a non-magnetic connection structure.

That is, a current flowing through the first heat wire 21 makes a U-turn at an end of the first heat wire 21 and then flows in and flows out of the second heat wire 22, and a current direction in the first heat wire 21 and a current direction in the second heat wire 22 are opposite to each other so that induced magnetic fields cancel each other, thereby forming the non-magnetic connection structure.

Meanwhile, since the first heat wire 21 is spirally wound in the rotating direction P1 using the core wire portion 10 as a rotation axis, the second heat wire 22 is spirally wound in the reverse-rotating direction P2 with the core wire portion 10 as a rotation axis, and the first and second heat wires 21 and 22 cross each other, the first and second heat wires 21 and 22 each covered by the Teflon layer 23 may increase flexibility and durability as well as tensile strength and bending strength. Accordingly, when the heating wire H according to the embodiment of the present invention is used by being wired to a mat-type or wearable electric heating product and then connected to a power controller, even when the heating wire H is repeatedly bent and deformed while external pressure is applied to the mat-type or wearable electric heating product, disconnection due to the bending deformation of the heating wire H may be prevented, and the risk of fire may be eliminated by such disconnection prevention.

The Teflon layer 23 may be formed by covering each of the first and second heat wires 21 and 22 with Teflon.

Here, the Teflon typically has a specific insulation breakdown voltage through extrusion molding, and thus, due to the insulation breakdown voltage of the Teflon layer 23 covered by Teflon, each of the first and second heat wires 21 and 22 is capable of withstanding a voltage of 2000 V AC or more with 10 mA AC, and this is a known technique and thus a detailed description thereof will be omitted below.

The covering material includes the first insulating covering material 30 made of a silicone or urethane material and the glass fiber covering material 50, and is configured to cover the heat wire portion 20 formed on the outer circumferential surface of the conductive covering material 11 that covers the core wire portion 10.

That is, the glass fiber covering material 50 covers both the core wire portion 10 and the heat wire portion 20, and the first insulating covering material 30 is configured to cover the glass fiber covering material 50.

The conductive layer 40 is formed by applying a graphene plate to a surface of each of the threads 12, compounding the graphene plate having a powder form, and then applying the compound to the surface of the threads 12.

That is, the graphene plate is a conventional material known to have a large surface area, excellent electrical conductivity, mechanical flexibility, and high thermal/chemical stability and may have a grain size of 0.1 to 100 µm. When the graphene plate is applied to the surface of each of the threads 12 to form the conductive layer 40, heat generated when the heat wire portion 20 is heated may be quickly transferred to a surface of the electric heating product, and thus, it is possible to save power consumption when using the electric heating product, and improve surface heating characteristics of the electric heating product.

Here, the plurality of first and second heat wires 21 and 22 are applied to the heating wire H, which is the embodiment of the present invention, as resistors, such that the heating wire H is applied to a massage device or the like belonging to a wearable electric heating product group.

That is, the wearable electric heating product includes a belt type or mini-pad type electric heating product which may be worn on each part of a body (e.g., a shoulder, a back, an abdomen, an arm, a leg, or the like), and when the heating temperature of the belt-type or mini-pad type electric heating product is high, there is a risk of burns, and thus, in order to prevent the burns, the plurality of first and second heat wires 21 and 22 are applied as resistors to form the heating wire H, and the heating wire H is applied to the electric heating product.

Modes of the Invention

Figure 7:
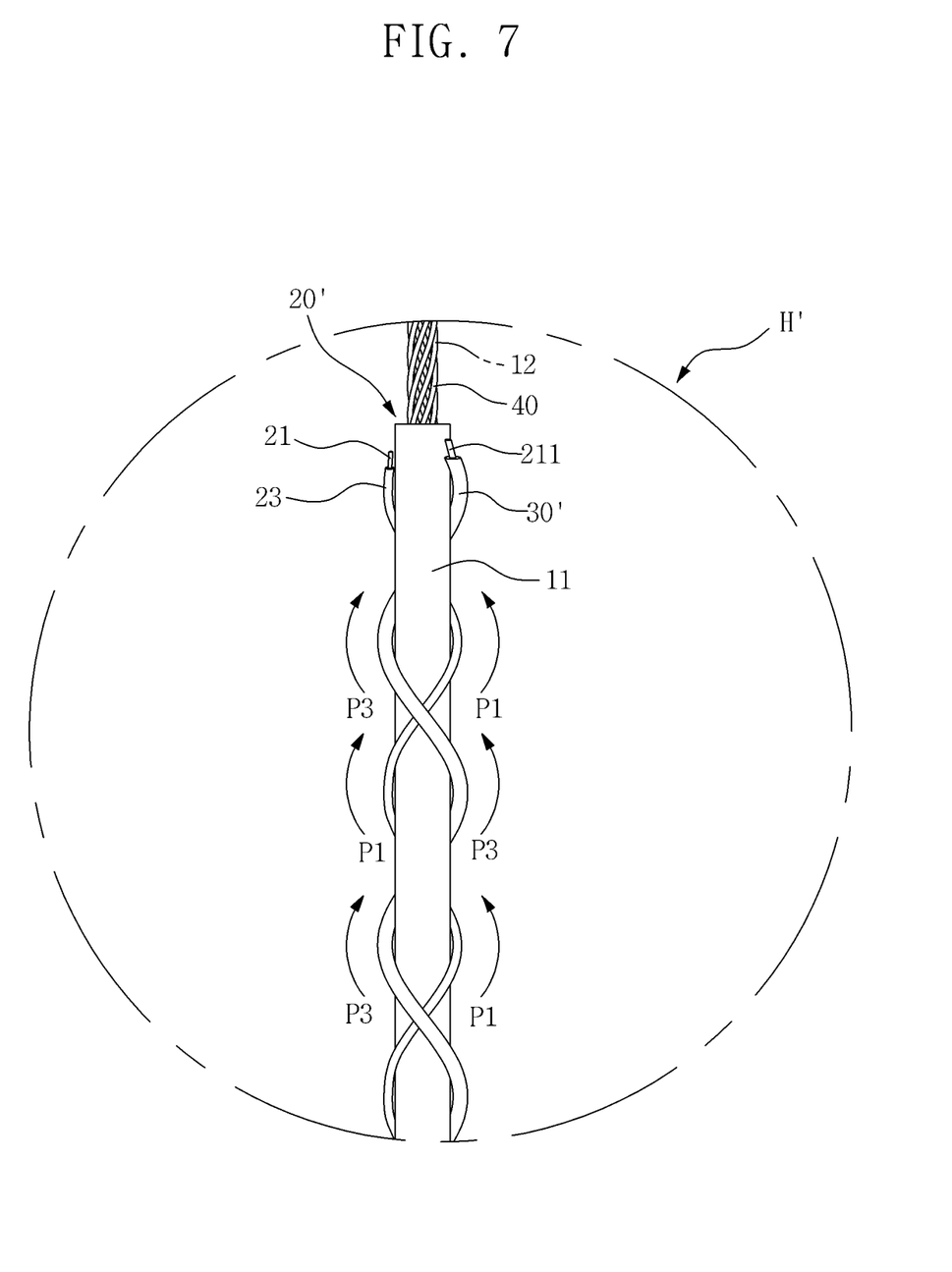
FIG. 7 is an enlarged view illustrating a state in which a heat wire and a copper wire are wound on a surface of a conductive covering material of a core wire portion according to another embodiment of the present invention.

The accompanying FIG. 7 illustrates another embodiment of the present invention, in which when a heating wire H' is applied to an electric heating product (e.g., a heated bed, mat, or the like) that transfers heat to an entire body, the heating wire H' is configured to generate high-temperature heat. Accordingly, in another embodiment of the present invention, when a heat wire portion 20' applied to the heating wire H' is configured, the heat wire portion 20' includes a first heat wire 21 covered by a Teflon layer 23 and a copper wire 211 covered by a second insulating covering material 30'.

Here, in a state in which the first heat wire 21 is spirally wound on an outer circumferential surface of a conductive covering material 11 in a rotating direction P1 (counterclockwise) with a core wire portion 10 as a rotation axis, and the copper wire 211 is spirally wound on the outer circumferential surface of the conductive covering material 11 in a reverse-rotating direction P3 (clockwise) with the core wire portion 10 as a rotation axis so as to cross the first heat wire 21, one side of the first heat wire 21 and one side of copper wire 211 are connected to each other, and the other side of the first heat wire 21 and the other side of the copper wire 211 are connected to a power controller (not shown), thereby forming a non-magnetic connection structure.

That is, a current flowing through the first heat wire 21 makes a U-turn at an end of the first heat wire 21 and then flows in and flows out of the copper wire 211, and a current direction in the first heat wire 21 and a current direction in the copper wire 211 are opposite to each other so that induced magnetic fields cancel each other, thereby forming a non-magnetic heat wire.

Hereinafter, the same reference numerals as those in FIGS. 1 to 6, which illustrate the embodiment of the present invention, are denoted by the same reference numerals, and thus a description thereof will be omitted.

Although the technical idea of the far infrared ray-radiating and electromagnetic wave-shielding heating wire using a graphene plate of the present invention has been described above with reference to the accompanying drawings, this exemplifies the most preferred embodiment of the present invention and does not limit the present invention.

Accordingly, it will be apparent to those skilled in the art that various modifications can be made in the present invention without departing from the spirit and scope of the present invention as defined in the appended claims, and it should be understood that such modifications fall within the scope of the appended claims.

INDUSTRIAL APPLICABILITY

Heating wires H and H' according to the embodiments of the present invention may be used after being wired to a mat-type electric heating product, including a heated bed or mat that transfers heat to a part of a body or the entire body, or a wearable electric heating product worn on a shoulder, a back, an abdomen, an arm, a leg, or the like, and then connected to a power controller, and even when the heating wires H and H' are repeatedly bent and deformed while external pressure is applied to the mat-type or wearable electric heating product, disconnection due to the bending deformation of the heating wires H and H' may be prevented, and the risk of fire may be eliminated due to such disconnection prevention.

The invention claimed is:

1. A far infrared ray-radiating and electromagnetic wave-shielding heating wire using a graphene plate, the heating wire comprising:

a core wire portion including a plurality of threads and a conductive covering material covering the threads;

a conductive layer formed on a surface of each of the threads, the conductive layer being formed of a graphene plate;

a first heat wire wound spirally on an outer circumferential surface of the conductive covering material in a first rotating direction;

a second heat wire wound spirally on the outer circumferential surface of the conductive covering material in a second rotating direction being opposite to the first rotating direction so that the first heat wire and the second heat wire cross each other on the outer circumferential surface of the conductive covering material;

a Teflon layer formed on an outer circumferential surface of each of the first heat wire and the second heat wire; and a covering material covering the core wire portion, the first heat wire, and the second heat wire, wherein one side of the first heat wire is connected to one side of the second heat wire, and the other side of the first heat wire and the other side of the second heat wire are connected to a power controller, respectively, so as to form a non-magnetic connection structure.

2. The heating wire of claim 1, wherein the conductive covering material is conductive silicone, and each of the threads is a flame-retardant thread or a glass fiber thread.

3. The heating wire of claim 1, wherein the covering material includes:

a glass fiber covering material covering the core wire portion, the first heat wire, and the second heat wire; and an insulating covering material covering the glass fiber covering material.

4. The heating wire of claim 3, wherein the insulating covering material is silicone or urethane.

* * * * *